United States Patent
Youssef et al.

(10) Patent No.: US 9,608,437 B2
(45) Date of Patent: Mar. 28, 2017

(54) ELECTRO-STATIC DISCHARGE PROTECTION FOR INTEGRATED CIRCUITS

(71) Applicant: QUALCOMM Incorporated, San Diego, CA (US)

(72) Inventors: Ahmed Abdel Monem Youssef, San Diego, CA (US); Prasad Srinivasa Siva Gudem, San Diego, CA (US); Li-Chung Chang, Irvine, CA (US); Ehab Ahmed Sobhy Abdel Ghany, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 247 days.

(21) Appl. No.: 14/024,833

(22) Filed: Sep. 12, 2013

(65) Prior Publication Data
US 2015/0070803 A1    Mar. 12, 2015

(51) Int. Cl.
| | |
|---|---|
| H02H 9/00 | (2006.01) |
| H02H 9/04 | (2006.01) |
| H01L 27/02 | (2006.01) |
| H03F 1/52 | (2006.01) |
| H03F 1/22 | (2006.01) |

(52) U.S. Cl.
CPC ......... *H02H 9/046* (2013.01); *H01L 27/0255* (2013.01); *H03F 1/223* (2013.01); *H03F 1/523* (2013.01); *H03F 2200/336* (2013.01); *H03F 2200/441* (2013.01); *H03F 2200/444* (2013.01)

(58) Field of Classification Search
CPC ................. H02H 9/04; H02H 9/042
USPC ................................................ 361/56
See application file for complete search history.

(56) References Cited

U.S. PATENT DOCUMENTS

| | | | | |
|---|---|---|---|---|
| 4,683,443 A | * | 7/1987 | Young | H03H 7/38 330/277 |
| 5,005,061 A | * | 4/1991 | Robb | H01L 27/0251 257/262 |
| 5,401,996 A | * | 3/1995 | Kelly | H01L 27/0251 257/140 |
| 5,521,783 A | * | 5/1996 | Wolfe et al. | 361/56 |
| 5,589,799 A | * | 12/1996 | Madaffari | H03F 3/1855 330/277 |

(Continued)

FOREIGN PATENT DOCUMENTS

WO    03049281 A1    6/2003

OTHER PUBLICATIONS

International Search Report and Written Opinion of the International Searching Authority for International Application No. PCT/US2014/054104, mailed Nov. 10, 2014, 12 pages.

(Continued)

*Primary Examiner* — Dharti Patel
(74) *Attorney, Agent, or Firm* — Toler Law Group, PC

(57) ABSTRACT

Techniques for improving electro-static discharge (ESD) performance in integrated circuits (IC's). In an aspect, one or more protective diodes are provided between various nodes of the IC. For example, protective diode(s) may be provided between the drain and gate of an amplifier input transistor, and/or between the drain and ground, etc. In certain exemplary embodiments, the amplifier may be a cascode amplifier. Further aspects for effectively dealing with ESD phenomena are described.

23 Claims, 13 Drawing Sheets

(56) References Cited

U.S. PATENT DOCUMENTS

| | | | |
|---|---|---|---|
| 6,218,883 B1* | 4/2001 | Takeuchi | H03F 3/1855 327/103 |
| 6,249,410 B1* | 6/2001 | Ker et al. | 361/56 |
| 6,617,649 B2 | 9/2003 | Chang et al. | |
| 7,593,204 B1 | 9/2009 | Iversen et al. | |
| 7,835,121 B2* | 11/2010 | Tiebout et al. | 361/56 |
| 7,848,068 B2 | 12/2010 | Chen et al. | |
| 8,213,142 B2* | 7/2012 | Worley | H01L 27/0255 361/118 |
| 8,331,068 B2 | 12/2012 | Lee et al. | |
| 2003/0102923 A1* | 6/2003 | Vickram | H03F 1/523 330/298 |
| 2004/0026760 A1* | 2/2004 | Dessard | H01L 27/092 257/500 |
| 2005/0045952 A1* | 3/2005 | Chatty et al. | 257/355 |
| 2005/0286188 A1* | 12/2005 | Camp et al. | 361/56 |
| 2006/0022272 A1* | 2/2006 | Chen | 257/355 |
| 2006/0231897 A1* | 10/2006 | Duvvury et al. | 257/356 |
| 2006/0268477 A1* | 11/2006 | Camp et al. | 361/56 |
| 2007/0058305 A1* | 3/2007 | Miske et al. | 361/56 |
| 2007/0058308 A1 | 3/2007 | Thijs et al. | |
| 2008/0062598 A1* | 3/2008 | Chen et al. | 361/56 |
| 2008/0074364 A1* | 3/2008 | Lara-Ascorra | H05B 33/0827 345/82 |
| 2008/0152171 A1* | 6/2008 | Hovesten | H01L 21/823462 381/111 |
| 2008/0198520 A1* | 8/2008 | Yun | 361/56 |
| 2008/0217650 A1* | 9/2008 | Morishita | 257/173 |
| 2010/0103572 A1* | 4/2010 | Worley | H01L 27/0255 361/56 |
| 2010/0103573 A1* | 4/2010 | Sasaki | 361/56 |
| 2010/0103872 A1* | 4/2010 | Park | H04L 45/24 370/328 |
| 2010/0246077 A1* | 9/2010 | Jeong et al. | 361/56 |
| 2011/0102081 A1* | 5/2011 | Su | H03F 1/52 330/252 |
| 2011/0286136 A1* | 11/2011 | Tsai | H02H 9/045 361/56 |
| 2012/0307405 A1* | 12/2012 | Chen et al. | 361/56 |
| 2013/0093508 A1* | 4/2013 | Sakamoto et al. | 327/566 |
| 2013/0113017 A1* | 5/2013 | Galy et al. | 257/124 |
| 2013/0161749 A1* | 6/2013 | Kim | 257/355 |
| 2013/0334695 A1* | 12/2013 | Tijssen et al. | 257/773 |
| 2014/0097906 A1* | 4/2014 | Jennings | H03F 3/185 330/306 |
| 2014/0268446 A1* | 9/2014 | Gudem | H02H 9/041 361/56 |

OTHER PUBLICATIONS

Linten, D. et al., "A 4.5 kV HBM, 300 V CDM, 1.2 kV HMM ESD Protected DC-to-16.1 GHz Wideband LNA in 98 nm CMOS," 2009 IEEE 31st EOS/ESD Symposium, Aug. 30, 2009-Sep. 4, 2009, pp. 1-6.

* cited by examiner

ELECTRO-STATIC DISCHARGE PROTECTION FOR INTEGRATED CIRCUITS

BACKGROUND

Field

The disclosure relates to electro-static discharge (ESD) protection for integrated circuits.

Background

State-of-the-art integrated circuits (IC's) feature increasingly dense circuitry and smaller device feature sizes due to continuous technology scaling. This trend increases the vulnerability of modern IC's to damage from electro-static discharge (ESD), making it important to provide adequate, robust ESD protection for modern IC's.

To ensure that an IC meets ESD requirements, predetermined test voltages may be externally applied across input/output (I/O) pins of the IC during manufacturing and testing. These test voltages may be generated according to various models known in the art for determining ESD compliance, e.g., charged-device model (CDM), human body model (HBM), machine model (MM), etc. When large test voltages are applied, the presence of parasitic inductances or resistances may undesirably cause large voltage drops to persist across critical terminals of the IC, potentially damaging sensitive circuitry.

Accordingly, it would be desirable to provide novel techniques for improving the robustness of ESD protection mechanisms in state-of-the-art IC's.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
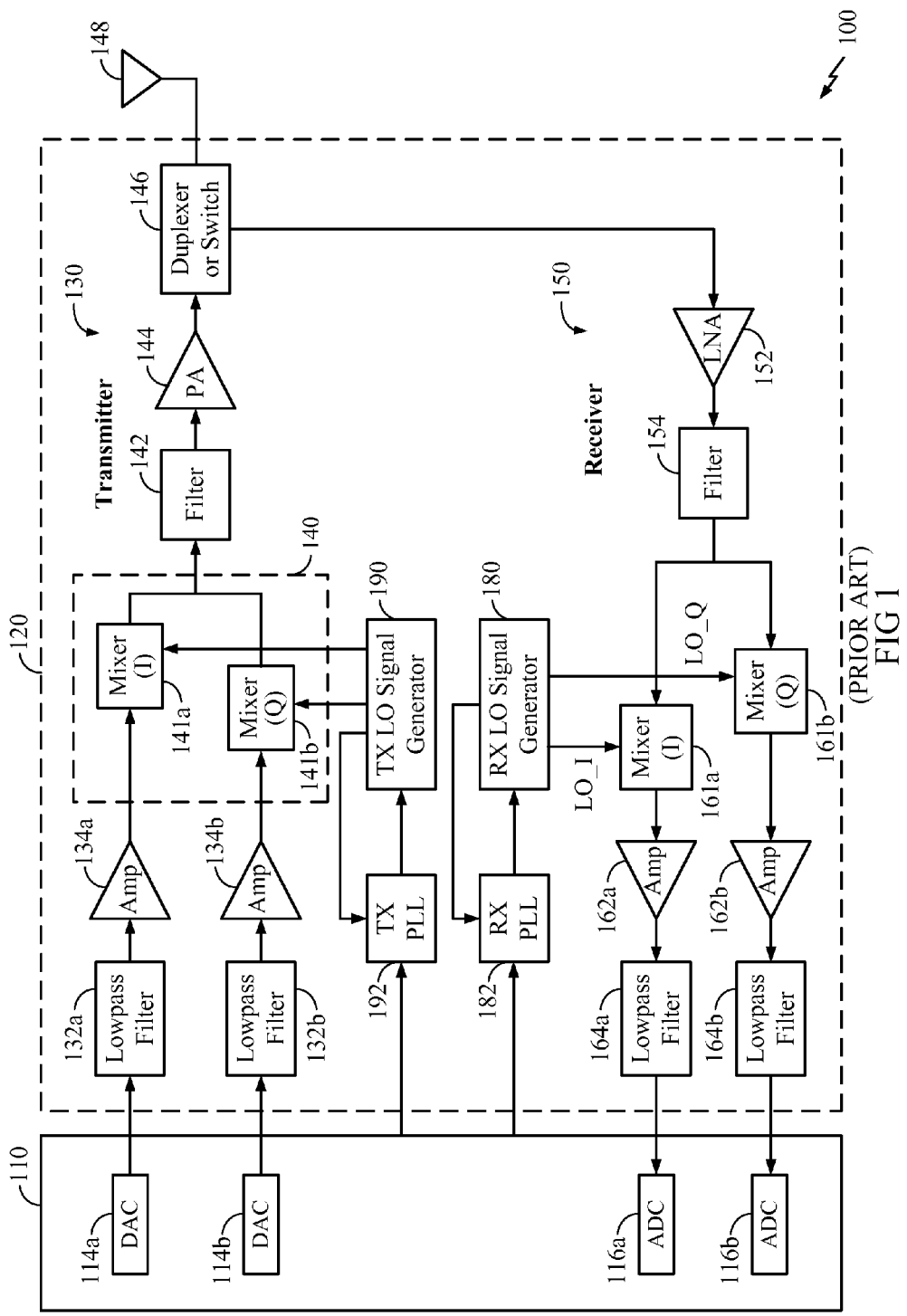
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), radio-frequency (RF) IC's, mixed-signal IC's, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114*a* and 114*b* for converting digital signals generated by the data processor 110 into the I and Q analog output signals, e.g., I and Q output currents, for further processing.

Within transmitter 130, lowpass filters 132*a* and 132*b* filter the I and Q analog output signals, respectively, to remove undesired images caused by the prior digital-to-analog conversion. Amplifiers (Amp) 134*a* and 134*b* amplify the signals from lowpass filters 132*a* and 132*b*, respectively, and provide I and Q baseband signals. An upconverter 140 that includes mixers 141*a* and 141*b* upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161*a* and 161*b* mix the output of filter 154 with I and Q receive (RX) LO signals (i.e., LO_I and LO_Q) from an RX LO signal generator 180 to generate I and Q baseband signals. The I and Q baseband signals are amplified by amplifiers 162*a* and 162*b* and further filtered by lowpass filters 164*a* and 164*b* to obtain I and Q analog input signals, which are provided to data processor 110. In the exemplary embodiment shown, the data processor 110 includes analog-to-digital-converters (ADC's) 116*a* and 116*b* for converting the I and Q analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

As LNA 152 and PA 144 may incorporate input/output (I/O) terminals that interface to nodes external to the IC, such circuit blocks may be exposed to possibly large electrical potentials from the external environment, making them more prone to damage. For example, contact with a human handler or industrial equipment, e.g., during manufacturing or testing, etc., can cause a significant amount of electrostatic charge to build up in an electronic device, e.g., due to friction, induction, etc. When such a charged electronic device comes into contact with an electrical discharge path, a surge of current may be generated through the electronic device, potentially causing catastrophic failure of the device. The current surge phenomenon can also occur when a charged body is brought into the vicinity of an electronic device, in which case the charged body may discharge through the electronic device, thereby damaging components of the electronic device.

Device failures such as described hereinabove can occur in all phases of semiconductor manufacturing and testing, and even in the field when the electronic device is being operated by an end-user. Accordingly, adequate protection strategies against ESD are useful in developing state-of-the-art RF and analog IC products.

Figure 2:
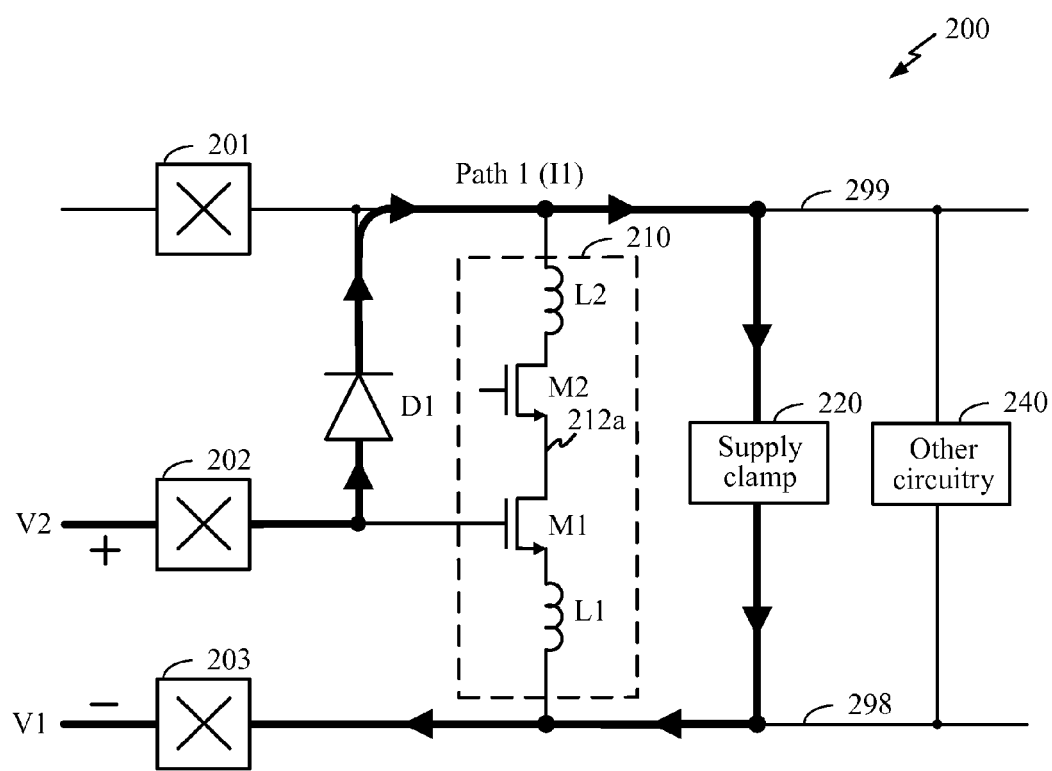
FIG. 2 illustrates a prior art implementation of an integrated circuit (IC) incorporating I/O pads and circuitry.

FIG. 2 illustrates a prior art implementation of an integrated circuit (IC) 200 incorporating input/output (I/O) pads and circuitry. Note FIG. 2 is shown for illustrative purposes only and is not meant to limit the scope of the present disclosure to any particular applications of the techniques disclosed herein. For example, an IC may generally include additional pads, circuitry, leads, etc., not necessarily shown in IC 200.

In FIG. 2, IC 200 includes I/O pads 201, 202, and 203. Pad 201 couples an externally provided supply voltage (e.g., VDD, not shown in FIG. 2) to a supply rail 299 of IC 200. Pad 202 couples an external voltage V2 to an input of IC 200, e.g., an amplifier input terminal of IC 200. Pad 203 couples an external voltage V1 to a ground terminal of IC 200. IC 200 further includes an amplifier 210, a supply clamp 220, and other circuitry 240, whose functions will be further described hereinbelow.

In FIG. 2, amplifier 210 is implemented using a cascode topology. In particular, amplifier 210 incorporates input transistor M1 and cascode transistor M2 coupled at node 212*a*, with the gate of M1 coupled to pad 202. Amplifier 210 further includes a load inductance L2 coupled to the drain of M2, and a source inductance L1 coupled to the source of input transistor M1. Note other circuit elements not shown may further be present in the amplifier 210. For example, a series inductance and/or resistance (not shown) may be further coupled to the gate of input transistor M1, etc.

Further note the preceding description of amplifier 210 is not meant to limit the scope of the present disclosure to cascode amplifier implementations. For example, a common-source amplifier design having an input transistor M1 coupled to an arbitrary load (e.g., not necessarily including cascode transistor M2) may readily utilize the techniques of the present disclosure. Furthermore, in certain implementations, the load inductance L2 may be mutually coupled to another inductor (not shown) as part of a transformer configuration to feed the input of a differential mixer (not shown). In alternative implementations, amplifier 210 may utilize an L-degenerated topology known in the art, in which case the source inductance L1 may be removed, and/or one or more shunt resistances may be added for matching. In further alternative implementations, the source inductance L1 may be replaced by a transformer, etc. It will be appreciated that the techniques described herein may readily be adapted to accommodate such other amplifier topologies as well.

To ensure that IC 200 meets specifications related to ESD, during a testing phase, predetermined test voltages may be externally applied across I/O pads to determine the response of IC 200 to certain ESD events. In particular, these test voltages may be generated and applied according to various models known in the art for determining ESD compliance, e.g., charged-device model (CDM), human body model (HBM), machine model (MM), etc. For example, CDM may emulate a scenario wherein an electronic device is charged to a high DC voltage (e.g., due to triboelectrification or an induction mechanism), and thereafter comes into the vicinity of a grounded conductor possibly touching one of the pins of the electronic device. Such a scenario can cause the charge stored inside the electronic device (and on all of its pins) to discharge through that pin through a low-impedance path to ground. Note it will be appreciated that the techniques of the present disclosure may also provide protection for other types of ESD events (not explicitly mentioned) besides CDM events.

To protect critical circuitry of IC 200 (e.g., amplifier 210, other circuitry 240, etc.) from ESD events, certain protection elements may be provided to shunt the ESD current away from critical circuitry. For example, if a significant transient positive voltage is developed across devices M1 and M2 (e.g., during an ESD testing event, such as a negative CDM event), a large portion of the current induced thereby may be shunted through a current path labeled Path 1 in FIG. 2. For example, pad 203 may be charged to a negative voltage (e.g., for a negative CDM testing event) or to a positive voltage (e.g., for a positive CDM test), and pad 202 may be coupled to ground. The resulting transient current may generate a large transient voltage across devices M1 and M2. In particular, a current I1 may flow through Path1 from V2 through pad 202, through a diode D1, supply rail 299, a (possibly bi-directional) supply clamp 220 coupling the supply rail 299 to ground rail 298, ground rail 298, and back to V1 via pad 203. As Path1 is designed to have low impedance, most of the current associated with the ESD event will be shunted through Path1, thereby protecting the critical circuitry of IC 200 to a certain degree.

In practice, however, large parasitic inductances and/or resistances may be present across Path1 due to, e.g., residual series impedances of the conducting paths, supply and/or ground rails, the supply clamp and/or other series protection circuitry, etc. It will be appreciated that such large series inductances may cause significant voltages to develop across terminals of M1 and M2, e.g., arising from Ohmic voltage drop. This large voltage drop may undesirably damage critical circuitry of IC 200, even when diode D1 and supply clamp 220 are provided, especially given the low rupture voltages characterizing state-of-the-art transistor processes. (For example, typical transistors fabricated using a 65-nm process may support a rupture voltage of 7V, while transistors fabricated using a 28-nm process may be able to support a rupture voltage of only 5V.) In an exemplary embodiment, the rupture voltage may correspond to the voltage that the gate-source junction or drain-source junction of a device may sustain without being damaged.

It will further be appreciated that in certain transceiver implementations, a transceiver input (e.g., the input to amplifier 210 of the receive portion) may be exposed to strong signals originating from a transmit portion of the transceiver. For example, in certain exemplary embodiments, a device may simultaneously support transmissions (TX) for a GSM network and reception (RX) for a CDMA network. In this exemplary embodiment, TX power leakage from the GSM transmitter to the CDMA receiver may also undesirably cause damage to the CDMA receiver.

Accordingly, it would be desirable to provide novel and robust techniques for effectively dealing with ESD events as well as certain other high-power events that may damage critical circuitry in an IC.

Figure 3:
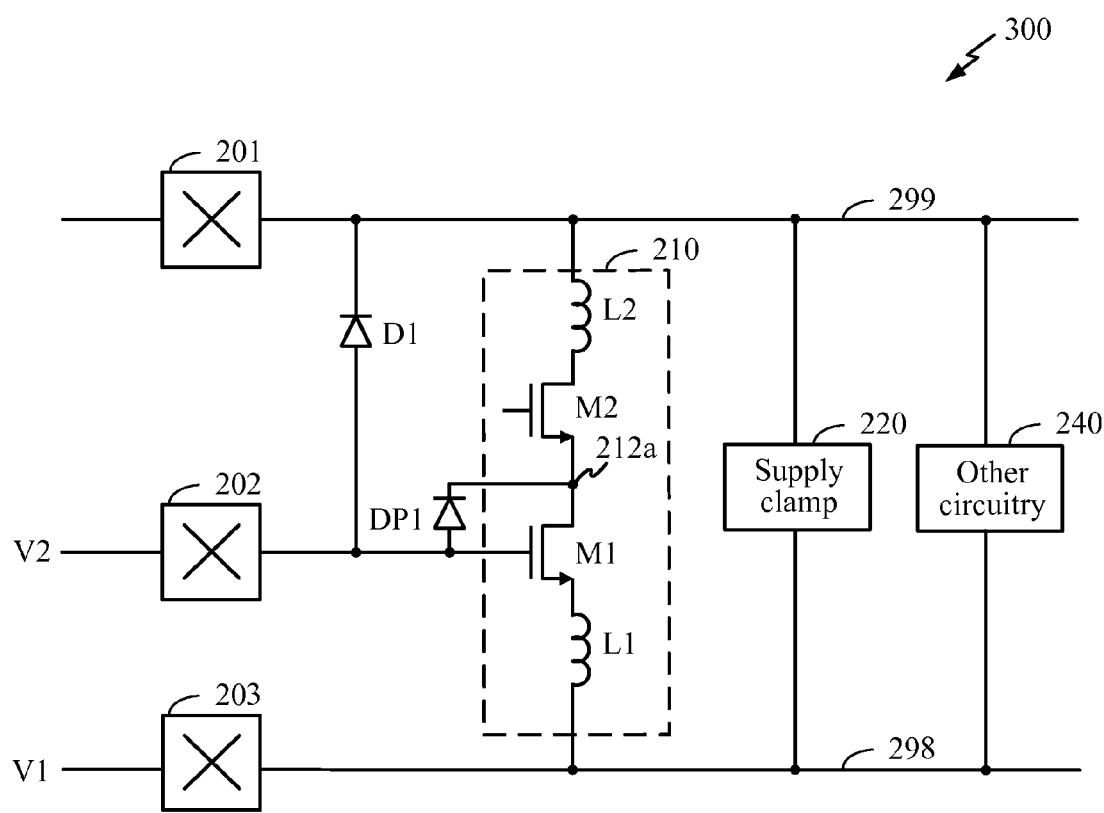
FIG. 3 illustrates an exemplary embodiment of an IC according to the present disclosure, wherein a protective diode is provided to deal with the aforementioned issues.

FIG. 3 illustrates an exemplary embodiment 300 of an IC according to the present disclosure, wherein a diode DP1 (also denoted herein as a "protective diode") is provided to deal with the aforementioned issues. Note FIG. 3 is shown for illustrative purposes only and is not meant to limit the scope of the present disclosure to any particular exemplary embodiment shown.

In FIG. 3, diode DP1 couples the gate of M1 to its drain. In the exemplary embodiment shown, DP1 is further configured such that it is forward-biased when a positive voltage exists between the gate and drain of M1. When a large positive voltage V2−V1>>0 is developed between pads 202 and 203, a portion of the current I1 originally shunted through Path1 in FIG. 2 is instead shunted through DP1 to the drain of M1, or node 212*a*. From node 212*a*, the shunted current may be further redirected to ground rail 298 through a number of paths, e.g., through the drain-source channel of M1, through the substrate of M1, etc. In this manner, as the current through Path1 is correspondingly reduced, the Ohmic voltage drop between V2 and V1 is also expected to be reduced, thus lowering the voltage stress on devices M1 and M2.

Note while one protective diode DP1 is shown in FIG. 3, alternative exemplary embodiments may incorporate any alternative number of diodes in series between the gate of M1 and its drain. It will be appreciated that multiple series-coupled diodes may advantageously increase the associated turn-on voltage of the ESD protection mechanism, thereby preventing (or reducing the likelihood of) accidental forward-biasing of the protective diodes during normal operation of the device.

One of ordinary skill in the art will appreciate that various techniques are known in the art for implementing the functionality of diode DP1, and/or any other diodes mentioned hereinbelow. For example, any of a junction diode, a gated diode, a silicon controlled rectifier, and a Schottky diode, etc., may be used. Such alternative exemplary embodiments are contemplated to be within the scope of the present disclosure.

It will be appreciated that a further advantage of providing a shunt current path through the drain of M1 to its source is that, due to the additional current flowing through the source of M1, the source voltage of M1 is expected to increase, thus decreasing the gate-to-source voltage of M1. This effect may advantageously reduce the stress placed on the gate-source junction of M1.

Figure 4:
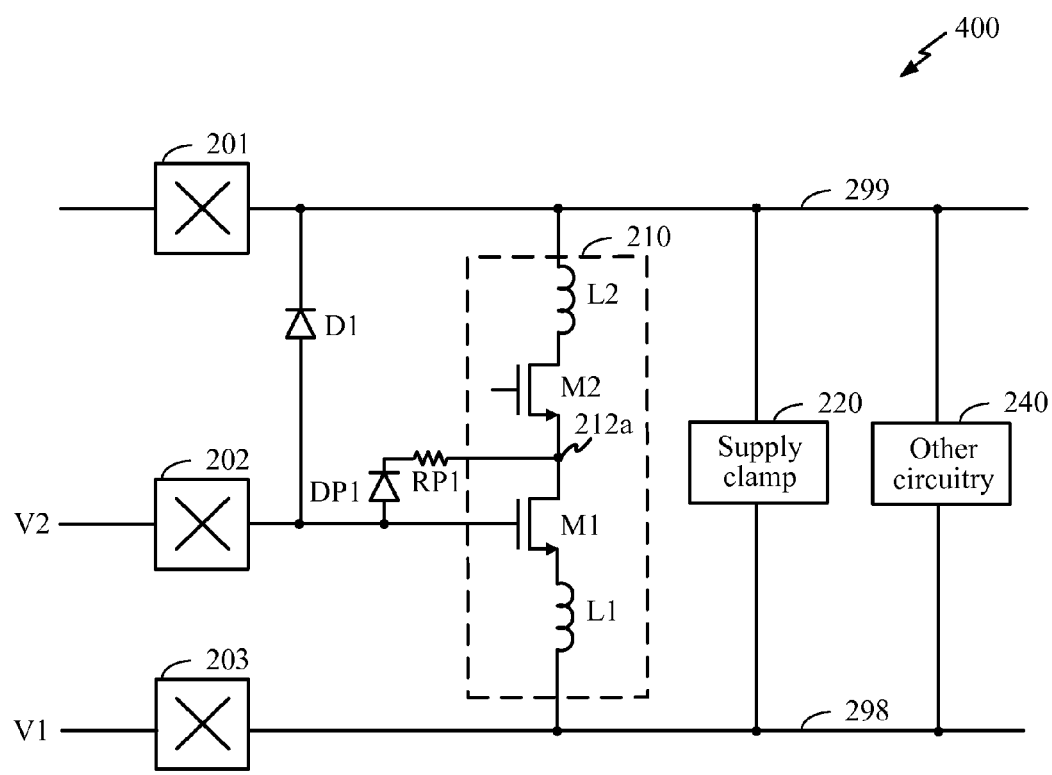
FIG. 4 illustrates an alternative exemplary embodiment of an IC according to the present disclosure incorporating an additional resistor.

FIG. 4 illustrates an alternative exemplary embodiment of an IC 400 according to the present disclosure incorporating an additional resistor RP1. Note FIG. 4 is shown for illustrative purposes only and is not meant to limit the scope of the present disclosure to any particular exemplary embodiment shown. In FIG. 4, the resistor RP1 is provided in series with DP1. It will be appreciated that, in certain exemplary embodiments, providing RP1 in series with DP1 may reduce the current passing through DP1, and therefore allow the size of DP1 to be reduced. Accordingly, this may advantageously reduce the size of parasitic elements (e.g., capacitances or resistances) associated with such diode, e.g., at the input to M1.

In certain exemplary embodiments, it will be appreciated that RP1 need not correspond to an explicitly provided resistance element in series with DP1. Instead, RP1 may be understood to simply model the inherent series resistance present when DP1 is provided in the manner shown. It will further be appreciated that an explicit or implicit resistance such as RP1 may generally be placed in series with any of the diodes described and/or illustrated in the present disclosure. Such exemplary embodiments are contemplated to be within the scope of the present disclosure.

Figure 5:
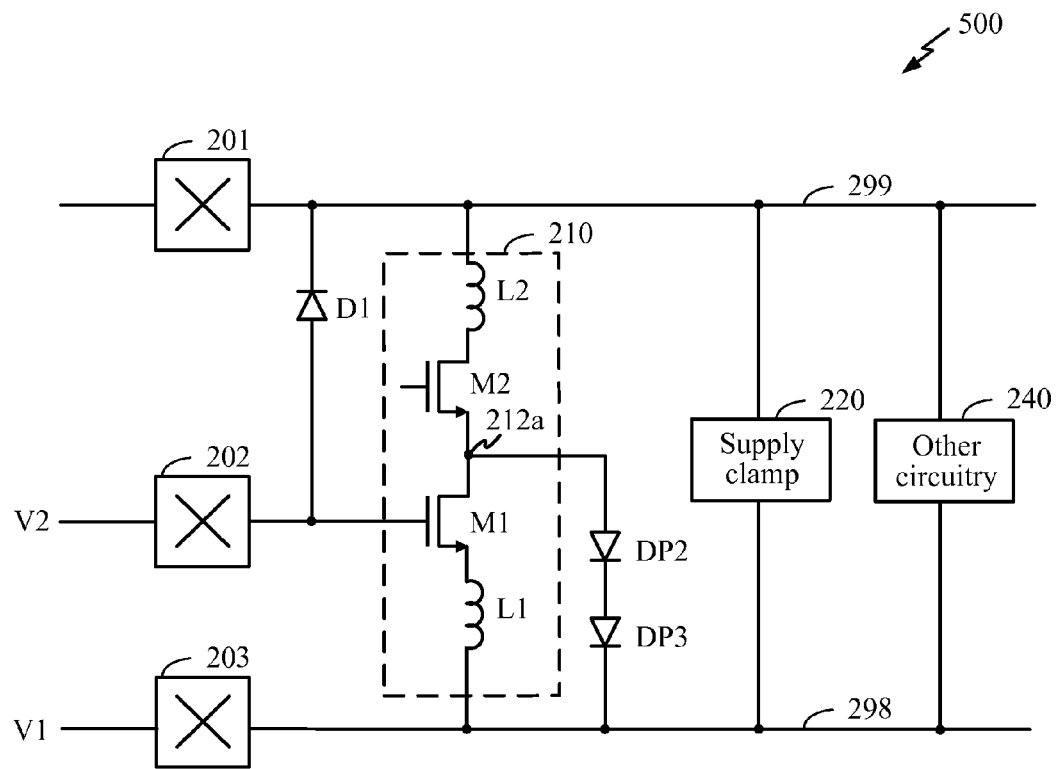
FIG. 5 illustrates an alternative exemplary embodiment of an IC according to the present disclosure incorporating multiple protective diodes.

FIG. 5 illustrates an alternative exemplary embodiment 500 of an IC according to the present disclosure incorporating multiple protective diodes. Note FIG. 5 is shown for illustrative purposes only, and is not meant to limit the scope of the present disclosure to any particular exemplary embodiment shown.

In FIG. 5, a diode DP2 is provided in series with a diode DP3, collectively coupling the drain of M1 or node 212a to ground. DP2 and DP3 are configured to be forward-biased when a significant positive voltage exists between the drain of M1 and ground. In particular, when a large positive voltage V2−V1 is present between pads 202 and 203, some of the current associated with Path1 will be shunted to node 212a, through DP2 and DP3, ground rail 298, and back to V1 via pad 203. In this manner, the persisting Ohmic voltage drop between pads 202 and 203 is expected to be reduced.

Note while two protective diodes DP2 and DP3 are shown coupled in series in FIG. 5, alternative exemplary embodiments may generally incorporate any plurality of diodes in series as a substitute for any diode shown herein in the figures, e.g., in FIG. 5 as well as in other figures. It will be appreciated that multiple series-coupled diodes may advantageously increase the associated turn-on voltage of the ESD protection mechanism, thereby preventing (or reducing the likelihood of) accidental forward-biasing of the protective diodes during normal operation of the device.

Figure 6:
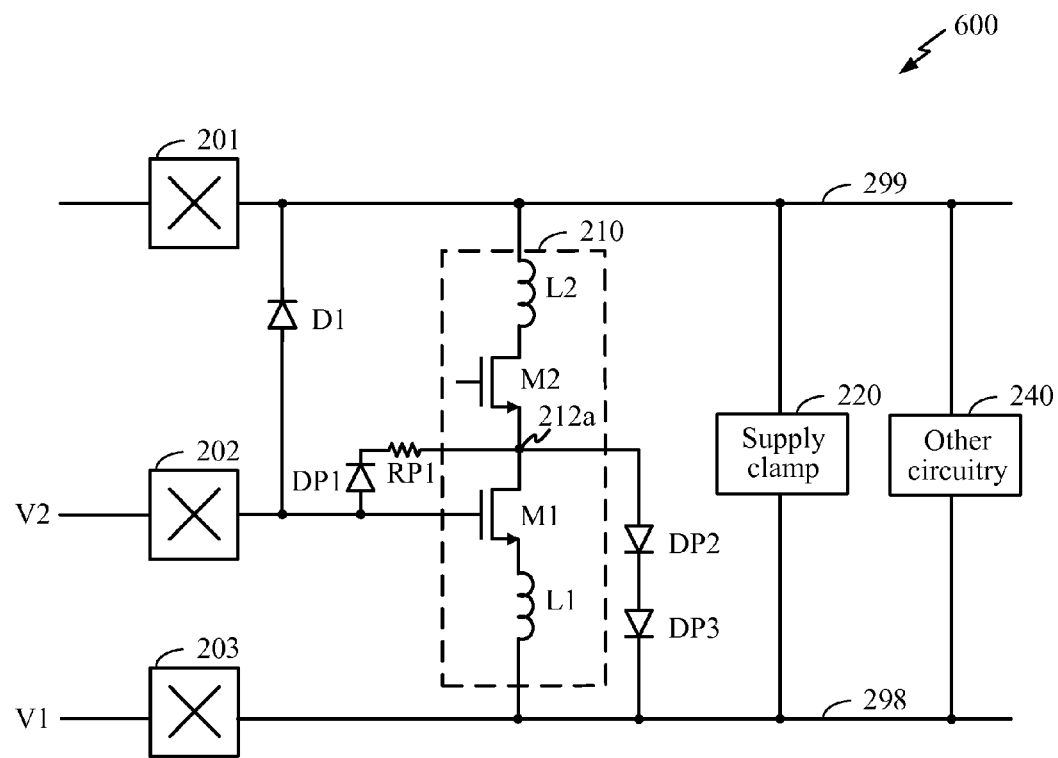
FIG. 6 illustrates an alternative exemplary embodiment of an IC according to the present disclosure incorporating multiple techniques of the present disclosure.

FIG. 6 illustrates an alternative exemplary embodiment 600 of an IC according to the present disclosure incorporating multiple techniques of the present disclosure. Note the exemplary embodiment 600 is shown for illustrative purposes only and is not meant to limit the scope of the present disclosure. Alternative exemplary embodiments may incorporate any subset or combination of the techniques shown in FIG. 6, and such alternative exemplary embodiments are contemplated to be within the scope of the present disclosure.

In FIG. 6, DP1 and RP1 couple the gate of M1 with its drain, while DP2 and DP3 collectively couple the drain of M1 to ground. It will be appreciated that the operating principles of the techniques applied to the exemplary embodiment 600 will be clear in light of the description hereinabove with reference to FIGS. 4-5, and thus their description will be omitted hereinbelow.

Figure 7:
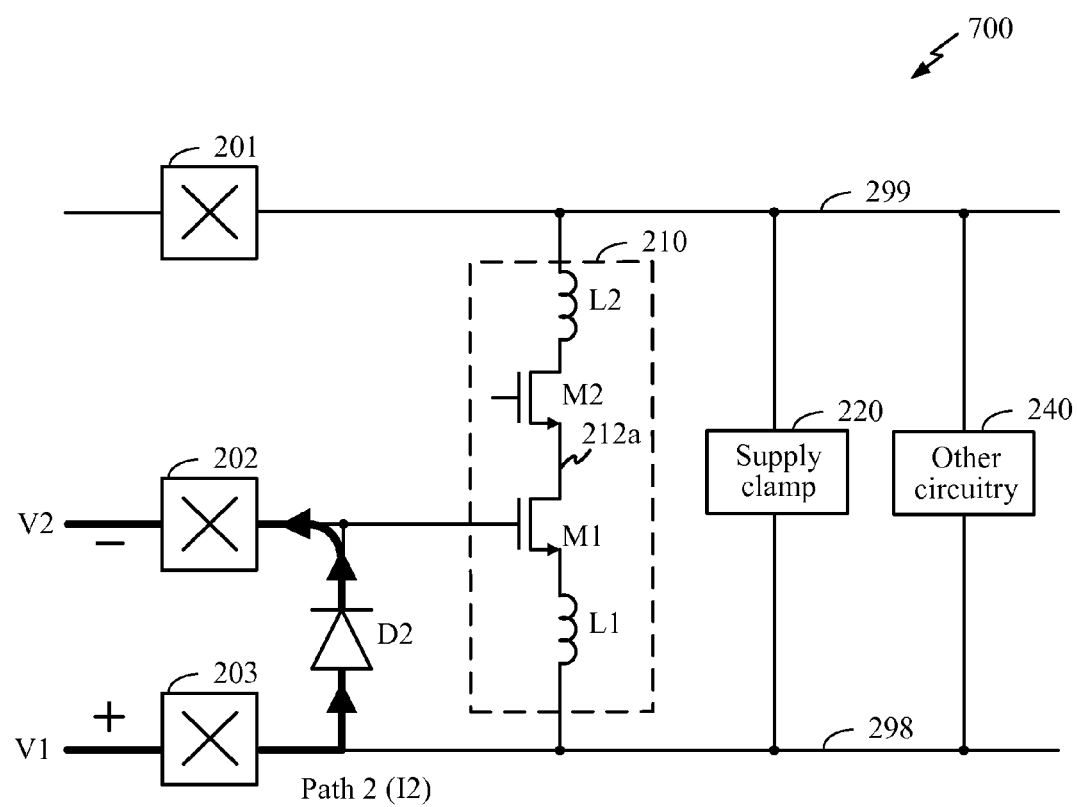
FIG. 7 illustrates an alternative prior art implementation of an integrated circuit (IC) incorporating I/O pads and circuitry.

FIG. 7 illustrates an alternative prior art implementation of an integrated circuit (IC) 700 incorporating input/output (I/O) pads and circuitry. Note similarly labeled elements in FIGS. 2 and 7 correspond to elements having similar functionality, and their description will accordingly be omitted hereinbelow.

In FIG. 7, IC 700 includes I/O pads 201, 202, 203, cascode amplifier 210, supply clamp 220, and other circuitry 240 as earlier described hereinabove with reference to IC 200 of FIG. 2. IC 700 further includes a diode D2 coupling the gate of M1 to ground rail 298. When a large negative voltage (e.g., V2−V1<<0) exists between the gate of M1 and ground rail 298 (or pads 202 and 203, respectively), D2 is configured to be forward-biased. If a significant transient negative voltage is applied across pads 202 and 203 (e.g., during an ESD testing event, such as a positive CDM event), a large portion of the current induced thereby will be shunted through a current path labeled Path2 in FIG. 7. In particular, a current flows through Path2 from V1 through pad 203, through D2, and back to V2 via pad 202. As Path2 is designed to have low impedance, most of the current associated with the ESD event will be shunted through Path2, thereby protecting critical circuitry of IC 700 (e.g., amplifier 210 and other circuitry 240) to a certain extent.

In practice, however, large parasitic series inductances in Path2 (not shown in FIG. 7) may cause a large voltage to develop across M1, which may cause a correspondingly large (negative) Ohmic voltage drop between V2 and V1. This large negative voltage drop may undesirably damage the critical circuitry of IC 700, even when D2 is provided. For example, the gate-source junction of M1 may break down in the presence of such a large negative voltage drop. Furthermore, when a significant negative voltage exists, some of the current generated thereby may be shunted through inductance L2, thereby causing significant ringing in the voltage response across L2 that could potentially damage the drain of M2 and/or M1.

Figure 8:
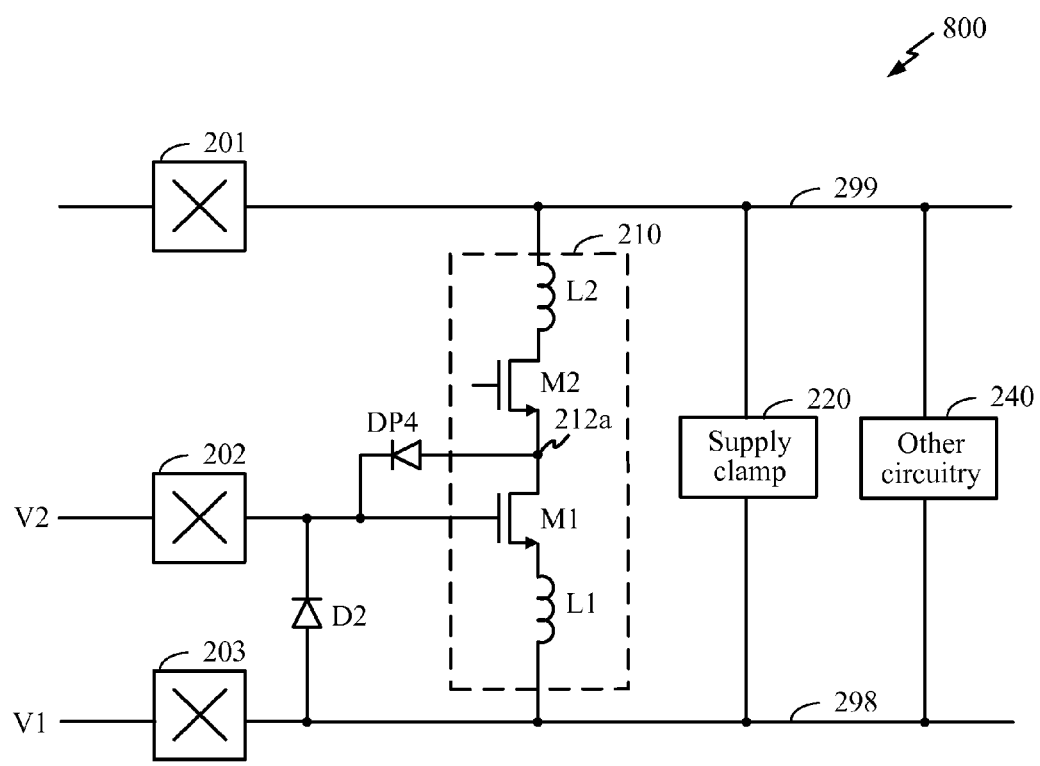
FIG. 8 illustrates an exemplary embodiment of an IC according to the present disclosure, wherein an additional protective diode is provided.

FIG. 8 illustrates an exemplary embodiment 800 of an IC according to the present disclosure, wherein a protective diode DP4 is provided. Note FIG. 8 is shown for illustrative purposes only and is not meant to limit the scope of the present disclosure to any particular exemplary embodiment shown.

In FIG. 8, a protective diode DP4 couples the drain of M1 to its gate. In the exemplary embodiment shown, DP4 is configured to be forward-biased when a positive voltage exists between the drain and gate of M1. It will be appreciated DP4 advantageously limits the voltage swing at the drain of M1, thus reducing the voltage stress on M1.

Figure 9:
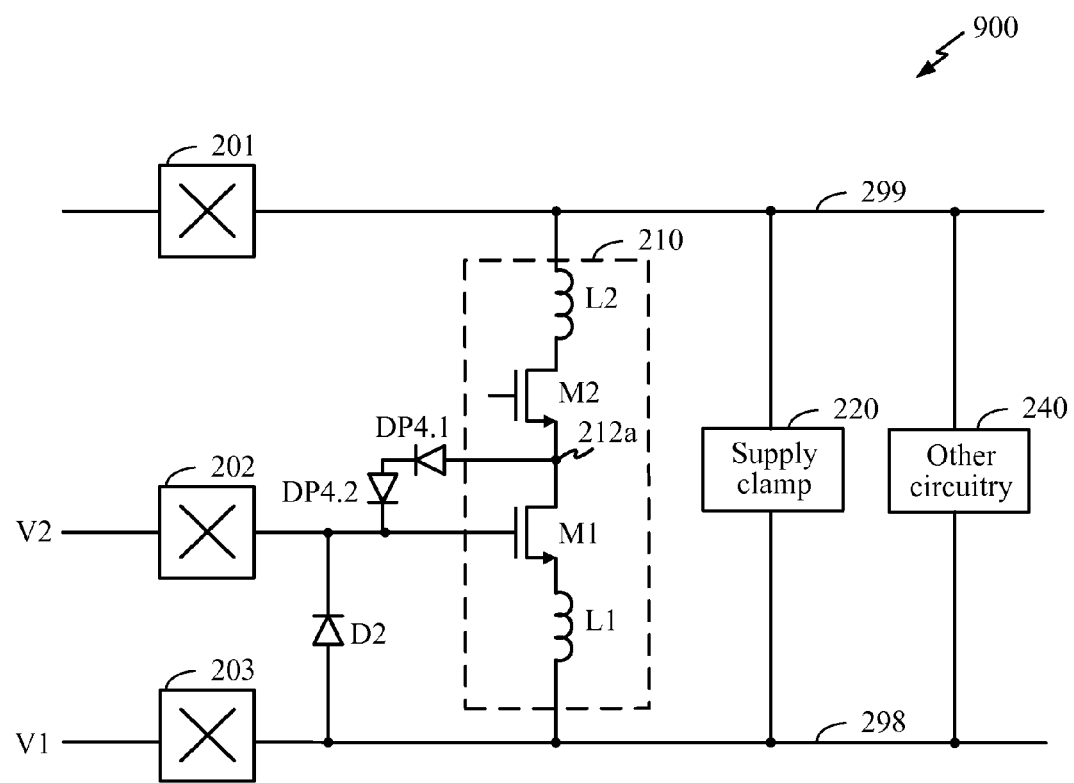
FIG. 9 illustrates an alternative exemplary embodiment of an IC according to the present disclosure, wherein two series-coupled diodes are provided.

Note while one protective diode DP4 is shown in FIG. 8, alternative exemplary embodiments may incorporate any number of diodes in series between the drain of M1 and its gate. It will be appreciated that multiple series-coupled diodes may advantageously increase the associated turn-on voltage of the ESD protection mechanism, thereby preventing (or reducing the likelihood of) accidental forward-biasing of the protective diodes during normal operation of the device. For example, FIG. 9 illustrates an alternative exemplary embodiment of an IC 900 according to the present disclosure, wherein two series-coupled diodes DP4.1 and DP4.2 are provided. Such alternative exemplary embodiments are contemplated to be within the scope of the present disclosure.

Figure 10:
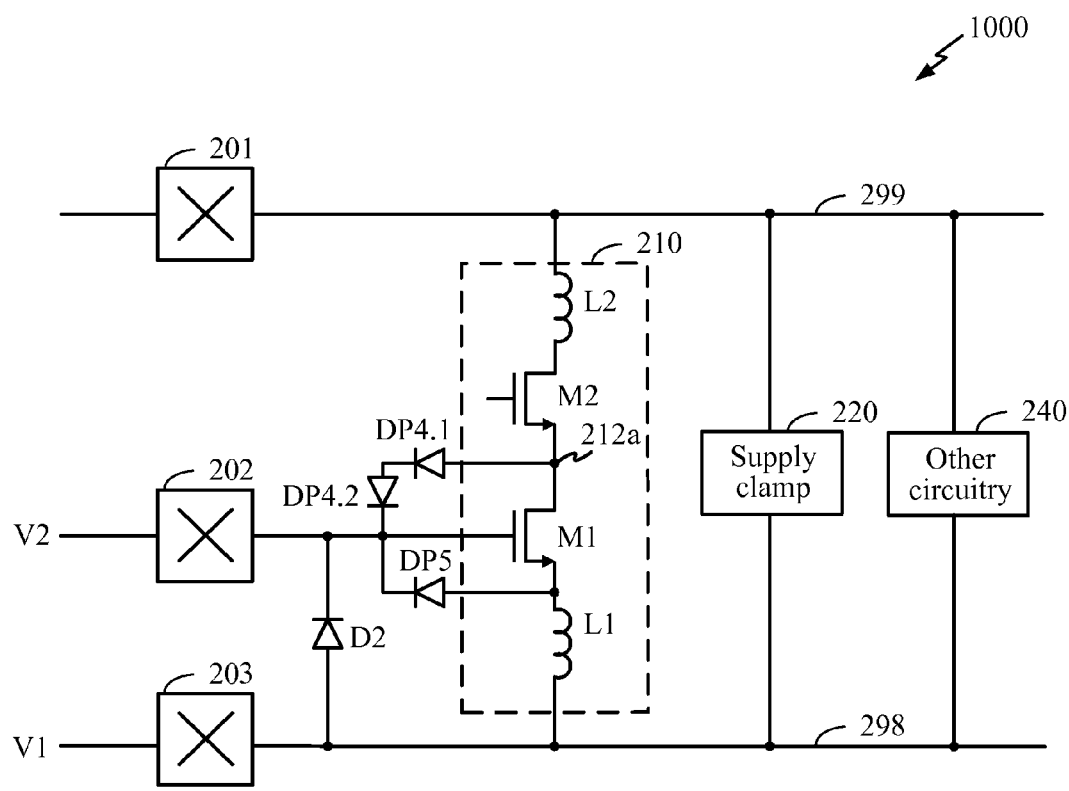
FIG. 10 illustrates an alternative exemplary embodiment of an IC incorporating further techniques of the present disclosure.

FIG. 10 illustrates an alternative exemplary embodiment of an IC 1000 incorporating further techniques of the present disclosure. In FIG. 10, series-coupled protective diodes DP4.1 and DP4.2 couple the drain of M1 to its gate, while a protective diode DP5 further couples the source of M1 to its gate. Note DP5 provides an alternative shunt current path for possible negative voltages between pad 202 and 203, and thus affords additional protection for the critical circuitry of IC 1000.

In particular, DP5 is configured to be forward-biased when a positive voltage exists between the source and gate of M1. When a large negative voltage V2−V1<<0 is applied between pads 202 and 203, some of the current I2 originally shunted through D2 is instead shunted through DP5, e.g., from ground rail 298, through DP5, and back to V2 via pad 202. In this manner, as the current through D2 is reduced, the Ohmic voltage drop between V2 and V1 may also be reduced.

It will be appreciated that the combination of DP4.1, DP4.2, and DP5 in the IC 1000 advantageously provides two parallel shunt current paths (e.g., one shunt path through the source of M1 to its gate, and one shunt path through the drain of M1 to its gate). Accordingly, greater ESD protection is afforded for IC 1000, e.g., when dealing with a positive CDM event.

Figure 11:
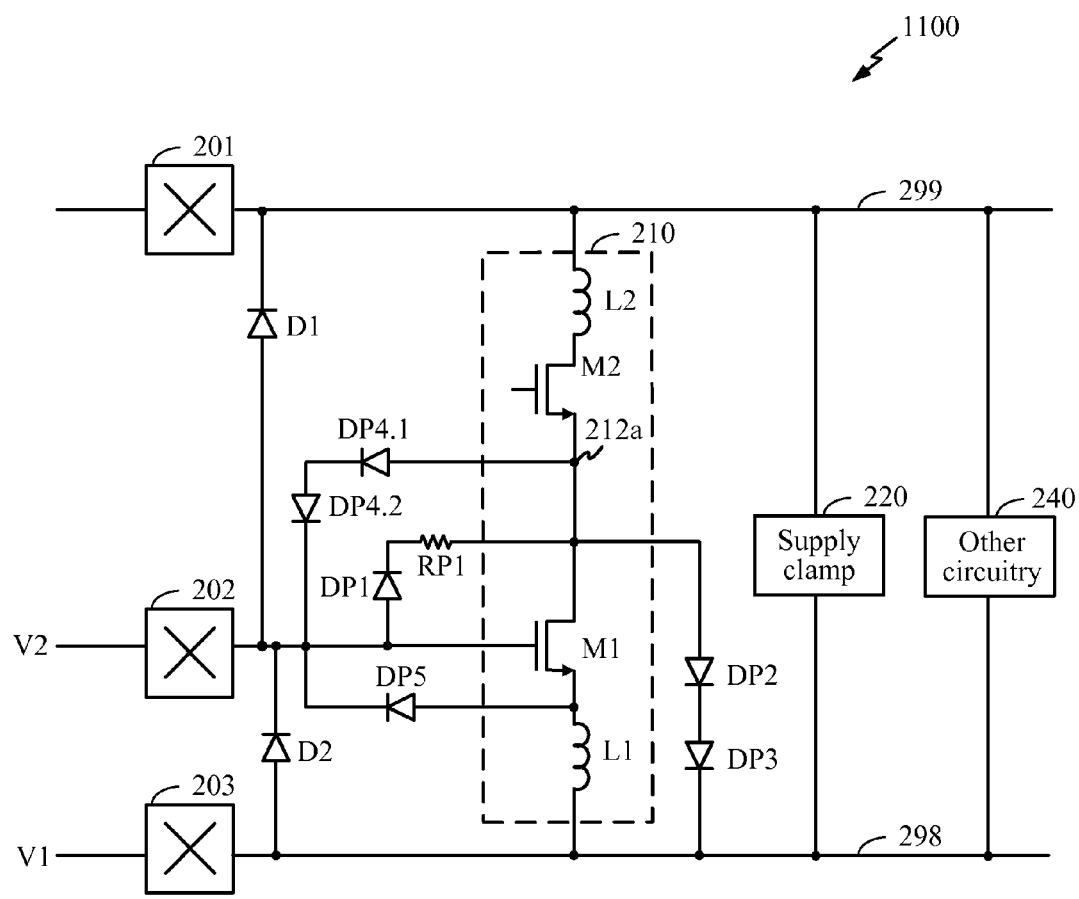
FIG. 11 illustrates an alternative exemplary embodiment of an IC according to the present disclosure incorporating multiple techniques of the present disclosure.

FIG. 11 illustrates an alternative exemplary embodiment 1100 of an IC according to the present disclosure incorporating multiple techniques of the present disclosure. Note the exemplary embodiment 1100 is shown for illustrative purposes only and is not meant to limit the scope of the present disclosure. Alternative exemplary embodiments may incorporate any subset of the techniques shown in FIG. 11, and such alternative exemplary embodiments are contemplated to be within the scope of the present disclosure.

In FIG. 11, DP1 and RP1 couple the gate of M1 with its drain, while DP2 and DP3 collectively couple the drain of M1 to ground. As further shown in FIG. 11, DP4.1 and DP4.2 collectively couple the drain of M1 with its gate, while DP5 couples the source of M1 to its gate. It will be appreciated that certain operating principles of the aforementioned techniques applied to the exemplary embodiment 1100 will be clear in light of the description hereinabove with reference to the other figures of the present disclosure, and thus their description will be omitted hereinbelow.

Figure 12:
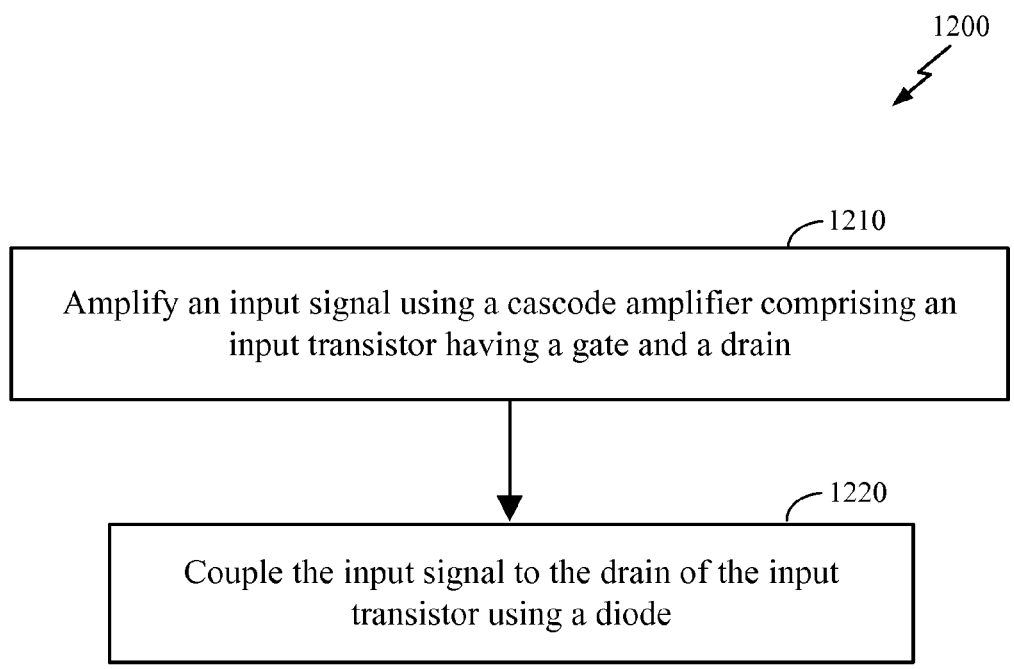
FIG. 12 illustrates an exemplary embodiment of a method according to the present disclosure.

FIG. 12 illustrates an exemplary embodiment of a method according to the present disclosure. Note FIG. 12 is shown for illustrative purposes only, and is not meant to limit the scope of the present disclosure to any particular method shown.

In FIG. 12, at block 1210, an input signal is amplified using a cascode amplifier comprising an input transistor having a gate and a drain.

At block 1220, the input signal is coupled to the drain of the input transistor using a diode.

Figure 13:
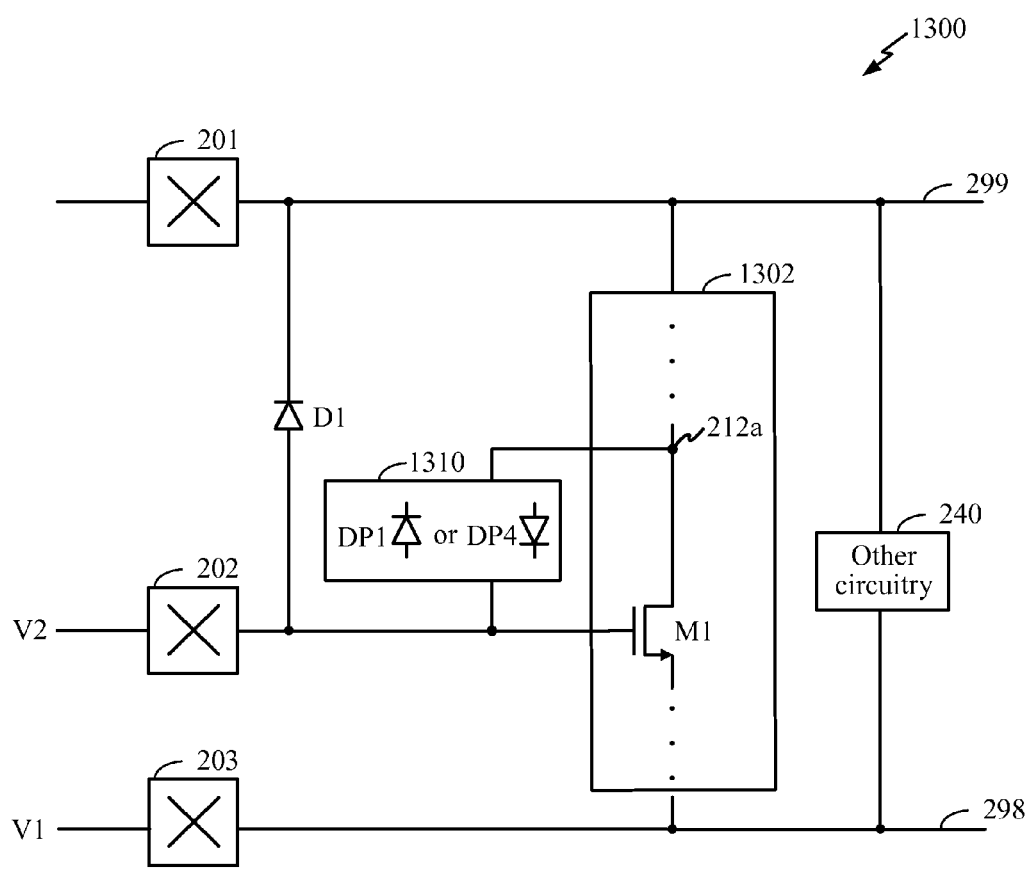
FIG. 13 illustrates an exemplary embodiment of an apparatus according to the present disclosure.

FIG. 13 illustrates an exemplary embodiment of an apparatus 1300 according to the present disclosure. Note similarly labeled elements in FIG. 13 and other figures herein may generally correspond to elements performing similar functionality, unless otherwise noted.

In FIG. 13, an amplifier 1302 includes an input transistor M1. Note elements potentially coupled to the drain of M1 are not explicitly shown in FIG. 13, but one of ordinary skill in the art will appreciate that such elements may include, e.g., one or more cascode transistors, loads, etc. Similarly, elements potentially coupled to the source of M1 are not explicitly shown in FIG. 13, but one of ordinary skill in the art will appreciate that such elements may include, e.g., one or more source degeneration inductors, etc. Such exemplary embodiments are contemplated to be within the scope of the present disclosure.

In FIG. 13, a diode block 1310 couples the gate to the drain of input transistor M1. In an exemplary embodiment, diode block 1310 may correspond to diode DP1 shown in FIG. 3, e.g., a diode configured to be forward-biased when the gate-to-drain voltage is positive. In an alternative exemplary embodiment, diode block 1310 may correspond to diode DP4 shown in FIG. 8, e.g., a diode configured to be forward-biased when the drain-to-gate voltage is positive. Note diode block 1310 may include other elements besides the diode DP1 or DP4 shown, e.g., a series-coupled resistor or a plurality of diodes, as earlier described hereinabove.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
an amplifier comprising an input transistor;
a cascode transistor coupled to a drain of the input transistor;
a first electrical path coupling a gate of the input transistor to the drain of the input transistor; and
a second electrical path that includes a diode, the second electrical path coupling the gate of the input transistor to the drain of the input transistor, the second electrical path in parallel with the first electrical path, the input transistor excluded from the first electrical path and the second electrical path.

2. The apparatus of claim 1, the diode configured to be forward-biased when a gate-to-drain voltage is positive.

3. The apparatus of claim 1, the diode configured to be forward-biased when a drain-to-gate voltage of the input transistor is positive.

4. The apparatus of claim 3, further comprising a third electrical path coupling the gate of the input transistor to the drain of the input transistor, the third electrical path in parallel with the first electrical path and the second electrical path, the input transistor independent from the third electrical path, the third electrical path including a second diode configured to be forward-biased when a gate-to-drain voltage is positive.

5. The apparatus of claim 3, further comprising a second diode coupling a source of the input transistor to the gate of the input transistor, the second diode configured to be forward-biased when a source-to-gate voltage is positive.

6. The apparatus of claim 1, wherein the second electrical path further includes a second diode coupled in series with the diode, and wherein the second diode is coupled between the diode and the gate.

7. The apparatus of claim 1, the amplifier further comprising a cascode transistor, wherein the cascode transistor is independent from the second electrical path, and wherein the diode is configured to be forward-biased when a gate-to-drain voltage of the input transistor is positive.

8. The apparatus of claim 1, the amplifier further comprising a cascode transistor, and the second electrical path including a resistor coupled in series with the diode.

9. An apparatus comprising:
an amplifier comprising an input transistor;
a first electrical path coupling a gate of the input transistor to a drain of the input transistor;
a second electrical path that includes a diode, the second electrical path coupling the gate of the input transistor to the drain of the input transistor, the second electrical path in parallel with the first electrical path, the input transistor excluded from the first electrical path and the second electrical path; and
a first integrated circuit pad and a second integrated circuit pad, wherein the first integrated circuit pad is coupled to the gate of the input transistor, and the second integrated circuit pad is coupled to a source of the input transistor.

10. An apparatus comprising:
an amplifier comprising an input transistor;
a first electrical path coupling a gate of the input transistor to a drain of the input transistor;
a second electrical path that includes a diode, the second electrical path coupling the gate of the input transistor to the drain of the input transistor, the second electrical path in parallel with the first electrical path, the input transistor excluded from the first electrical path and the second electrical path; and
a resistor coupled in series with the diode, wherein the second electrical path includes the resistor.

11. An apparatus comprising:
an amplifier comprising an input transistor;
a first electrical path coupling a gate of the input transistor to a drain of the input transistor;
a second electrical path that includes a diode, the second electrical path coupling the gate of the input transistor to the drain of the input transistor, the second electrical path in parallel with the first electrical path, the input transistor excluded from the first electrical path and the second electrical path; and
two diodes coupling the drain of the input transistor to a ground terminal.

12. An apparatus comprising:
means for amplifying an input signal;
means for enabling current flow along a first path between a gate of the means for amplifying and a drain of the means for amplifying;

means for enabling current flow along a second path between the gate of the means for amplifying and the drain of the means for amplifying, the second path in parallel with the first path, the means for amplifying excluded from the first path and the second path, the second path including a diode;

means for receiving a first external signal coupled to the gate of the means for amplifying; and means for receiving a second external signal coupled to a source of the means for amplifying.

13. The apparatus of claim 12, further comprising second means for amplifying an output of the means for amplifying, wherein the second means for amplifying is independent from the means for enabling current flow along the second path, and wherein the diode is configured to be forward-biased when a gate-to-drain voltage of the means for amplifying is positive.

14. The apparatus of claim 12, further comprising second means for amplifying an output of the means for amplifying, wherein the second means for amplifying is independent from the means for enabling current flow along the second path, and wherein the means for enabling current flow along the second path includes a resistor coupled in series with the diode.

15. The apparatus of claim 12, further comprising means for enabling current to flow along a third path from the drain of the means for amplifying to ground.

16. The apparatus of claim 15, the means for enabling current to flow along the third path including multiple diodes.

17. An apparatus comprising:
an amplifier including a transistor;
a cascode transistor coupled to a drain of the transistor;
a first diode coupled to the drain;
a second diode coupling the first diode to ground, the first diode and the second diode configured to be forward-biased from the drain to a ground terminal; and
a third diode coupled to a gate of the transistor and the drain.

18. The apparatus of claim 17, further comprising:
a first electrical path coupling a gate of the transistor to the drain of the transistor; and
a second electrical path coupling the drain of the transistor to the ground terminal, the transistor independent of the first electrical path and the second electrical path, the second electrical path including the first diode and the second diode.

19. The apparatus of claim 18, further comprising a third electrical path coupling the gate of the transistor to the drain of the transistor, the third electrical path in parallel with the first electrical path, the transistor independent of the third electrical path, the third electrical path including a third diode and a resistor, the third diode configured to be forward-biased when a gate-to-drain voltage of the transistor is positive, and wherein the third diode is coupled in series with the resistor.

20. The apparatus of claim 17, the third diode configured to be forward-biased when a gate-to-drain voltage is positive.

21. An apparatus comprising:
an amplifier comprising an input transistor;
a diode coupling a gate of the input transistor to a drain of the input transistor;
a cascode transistor coupled to the drain of the input transistor; and
a resistor coupled in series with the diode, the resistor further coupled to the drain of the input transistor.

22. The apparatus of claim 21, the diode configured to be forward-biased when a gate-to-drain voltage of the input transistor is positive.

23. The apparatus of claim 21, wherein a first terminal of the diode is coupled to the gate of the input transistor, wherein a second terminal of the diode is coupled to a first terminal of the resistor, and wherein a second terminal of the resistor is coupled to the drain of the input transistor and to a source of the cascode transistor.

* * * * *